(12) United States Patent
Yuan et al.

(10) Patent No.: US 12,174,532 B2
(45) Date of Patent: Dec. 24, 2024

(54) MANUFACTURING A FLOWCELL WITH A PLANAR WAVEGUIDE

(71) Applicant: ILLUMINA, INC., San Diego, CA (US)

(72) Inventors: Dajun Yuan, San Diego, CA (US); M. Shane Bowen, Encinitas, CA (US); Zhong Mei, La Jolla, CA (US)

(73) Assignee: ILLUMINA, INC., San Diego, CA (US)

( * ) Notice: Subject to any disclaimer, the term of this patent is extended or adjusted under 35 U.S.C. 154(b) by 277 days.

(21) Appl. No.: 17/255,393

(22) PCT Filed: May 28, 2020

(86) PCT No.: PCT/IB2020/055055
§ 371 (c)(1),
(2) Date: Dec. 22, 2020

(87) PCT Pub. No.: WO2020/240453
PCT Pub. Date: Dec. 30, 2020

(65) Prior Publication Data
US 2022/0075263 A1   Mar. 10, 2022

Related U.S. Application Data

(60) Provisional application No. 62/853,350, filed on May 28, 2019.

(30) Foreign Application Priority Data

Jul. 17, 2019  (NL) ..................................... 2023516

(51) Int. Cl.
*G03F 7/00* (2006.01)
*B01L 3/00* (2006.01)
(Continued)

(52) U.S. Cl.
CPC ...... *G03F 7/0002* (2013.01); *B01L 3/502707* (2013.01); *B01L 3/5085* (2013.01);
(Continued)

(58) Field of Classification Search
CPC ...... C08L 2666/04; C08L 31/00; C08L 63/10; C08L 67/06; B01J 19/0046;
(Continued)

(56) References Cited

U.S. PATENT DOCUMENTS 6,483,096 B1   11/2002   Kunz et al.
7,476,503 B2    1/2009   Turner et al.
(Continued)

FOREIGN PATENT DOCUMENTS

CN   102713572 A   10/2012
CN   107709974 A    2/2018
(Continued)

OTHER PUBLICATIONS

International Search Report and Written Opinion received for PCT/IB2020/055055, dated Aug. 17, 2020.
(Continued)

*Primary Examiner* — Jennifer Wecker
*Assistant Examiner* — Jonathan Bortoli
(74) *Attorney, Agent, or Firm* — MARSHALL, GERSTEIN & BORUN LLP

(57) ABSTRACT

Provided in one example is a method of manufacturing a flowcell that includes: forming a core layer, the core layer disposed between a substrate and a nanowell layer, the nanowell layer having nanowells to receive a sample, the core layer having a higher refractive index than the substrate and the nanowell layer; and forming a grating to couple light to the core layer.

13 Claims, 11 Drawing Sheets

(51) Int. Cl.
G01N 21/64 (2006.01)
G02B 5/18 (2006.01)

(52) U.S. Cl.
CPC ..... *G01N 21/6428* (2013.01); *G01N 21/6486* (2013.01); *G02B 5/1857* (2013.01); *B01L 2300/0896* (2013.01); *B01L 2300/168* (2013.01); *G01N 2021/6439* (2013.01)

(58) Field of Classification Search
CPC .... B01J 2219/00286; B01J 2219/00317; B01J 2219/0045; B01J 19/00; B01J 2219/0086; B01J 2219/00864; B01L 2200/12; B01L 2300/0636; B01L 2300/0654; B01L 2300/0877; B01L 2300/0893; B01L 2300/0896; B01L 2300/168; B01L 3/502707; B01L 3/5085; B01L 2300/0829; B01L 3/00; G01N 2021/6439; G01N 21/6428; G01N 21/6486; G01N 2021/6421; G01N 21/0303; G01N 21/05; G01N 21/6452; G01N 21/648; G02B 5/1857; G03F 7/0002; C12Q 1/6869; C12Q 2563/107; C12Q 2565/631

See application file for complete search history.

(56) References Cited

U.S. PATENT DOCUMENTS

| | | | |
|---|---|---|---|
| 8,241,573 | B2 | 8/2012 | Banerjee et al. |
| 8,532,450 | B1 * | 9/2013 | Wang ................... G02B 5/1857 385/10 |
| 9,670,535 | B2 | 6/2017 | Bowen et al. |
| 10,059,992 | B2 | 8/2018 | Dehlinger et al. |
| 2002/0076154 | A1 | 6/2002 | Maisenhoelder et al. |
| 2003/0012483 | A1 | 1/2003 | Ticknor et al. |
| 2003/0027328 | A1 | 2/2003 | Cunningham et al. |
| 2005/0110989 | A1 | 5/2005 | Schermer et al. |
| 2006/0008206 | A1 | 1/2006 | Maisenhoelder et al. |
| 2007/0009968 | A1 | 1/2007 | Cunningham et al. |
| 2009/0247414 | A1 | 10/2009 | Obradovic et al. |
| 2011/0306143 | A1 | 12/2011 | Chiou et al. |
| 2013/0288357 | A1 | 10/2013 | Tiefenthaler |
| 2014/0178861 | A1 | 6/2014 | Duer |
| 2014/0287964 | A1 * | 9/2014 | Lundquist .......... G01N 21/6454 506/38 |
| 2016/0216538 | A1 | 7/2016 | McDonald et al. |
| 2018/0274026 | A1 | 9/2018 | Brown et al. |

FOREIGN PATENT DOCUMENTS

| | | |
|---|---|---|
| JP | 2009-510391 A | 3/2009 |
| JP | 2009-524017 A | 6/2009 |
| JP | 2013-524174 A | 6/2013 |
| JP | 2014-016458 A | 1/2014 |
| JP | 2014-240065 A | 12/2014 |
| JP | 2017-527850 A | 9/2017 |
| RU | 2008 144 969 A | 5/2010 |
| TW | 200639525 A | 11/2006 |
| WO | WO-2008/028160 A2 | 3/2008 |
| WO | WO-2017/006679 A1 | 1/2017 |

OTHER PUBLICATIONS

Kehagias et al.: "Stamp replication for thermal and UV nanoimprint lithography using a UV-sensitive silsesquioxane resist", Microelectronic Engineering, vol. 86, 2009, pp. 776-778, XP026106271.
Search Report received for NL Application No. 2023516, dated Jul. 17, 2019.

* cited by examiner

100

MANUFACTURING A FLOWCELL WITH A PLANAR WAVEGUIDE

CROSS-REFERENCE TO RELATED APPLICATIONS

This application is a 35 U.S.C. § 371 National Stage of International Patent Application No. PCT/IB2020/055055, filed May 28, 2020, which itself claims the benefit of and priority to U.S. Provisional Patent Application No. 62/853,350, filed May 28, 2019, and Dutch Patent Application N2023516, filed Jul. 17, 2019, the content of each of which is incorporated by reference herein in its entirety and for all purposes.

BACKGROUND

Samples of different materials can be analyzed using one or more of a variety of analytical processes. For example, sequencing such as high-throughput DNA sequencing can be the basis for genomic analysis and other genetic research. For example, sequencing by synthesis (SBS) technology uses modified deoxyribonucleotide triphosphates (dNTPs) including a terminator and a fluorescent dye having an emission spectrum. In this and other types of sequencing, characteristics of a sample of genetic material are determined by illuminating the sample, and by detecting emission light (e.g., fluorescent light) that is generated in response to the illumination. The quality of the illumination can determine the quality and efficiency of the detection of the emission light. For example, if a significant portion of the illuminating light does not reach the relevant sample material this can result in a low level of efficiency in the system. As another example, if illuminating light inadvertently impinges on other parts of the sample, this can result in sample degradation.

SUMMARY

In a first aspect, a method of manufacturing a flowcell includes: forming a core layer, the core layer disposed between a substrate and a nanowell layer, the nanowell layer having nanowells to receive a sample, the core layer having a higher refractive index than the substrate and the nanowell layer; and forming a grating to couple light to the core layer.

Implementations can include any or all of the following features in any suitable combinations. Forming the grating comprises photolithographic pattering, nanoimprinting, or both. The core layer is formed in a common process with forming the grating. The core layer is formed in a separate process from forming the grating. The grating is formed by photolithographic patterning onto the substrate, the core layer is formed onto the grating, and the nanowell layer is formed onto the core layer. The grating is formed by nanoimprinting onto the substrate, the core layer is formed onto the grating, and the nanowell layer is formed onto the core layer. The grating is formed onto the substrate, the core layer is formed onto the grating, an additional layer is formed onto the core layer, and the nanowell layer is formed onto the additional layer. The additional layer and the nanowell layer are initially free of the nanowells before formation of the nanowells, the method further comprising patterning the nanowell layer to form the nanowells while the additional layer remains intact, and subsequently transferring the pattern of the nanowell layer to the additional layer so as to expose the core layer in the nanowells. The pattern is transferred by etching. The core layer is formed onto the substrate, and wherein the grating and the nanowells layer are formed onto the core layer. The core layer is formed onto the substrate, the grating is formed onto the core layer, and the nanowell layer is formed onto the grating. The core layer is formed onto the substrate, a first layer is formed onto the core layer, a second layer is formed onto the first layer, and wherein the grating and the nanowells are formed into the first and second layers, respectively. The core layer is formed onto the substrate, a resin layer is formed onto the core layer, and the grating and the nanowells are formed in the resin layer. The grating and the nanowell layer are formed in a common process. The grating and the nanowell layer are formed in a same layer of the flowcell. The grating and the nanowell layer are formed in separate layers of the flowcell.

In a second aspect, a flowcell includes: a substrate; a nanowell layer having nanowells to receive a sample; a core layer disposed between the substrate and the nanowell layer, the core layer having a higher refractive index than the substrate and the nanowell layer; and a grating to couple light to the core layer.

Implementations can include any or all of the following features. The grating is disposed over the substrate, the core layer is disposed over the grating, and the nanowell layer is disposed over the core layer. A grating layer covers the substrate, the grating layer including the grating. A first resin layer including the grating is disposed over the substrate, and a second resin layer including the nanowells is disposed over the first resin layer. The grating is disposed over the substrate, a first polymer layer is disposed over the grating, and a second polymer layer is disposed over the first polymer layer, wherein the nanowells a disposed in the first and second polymer layers. The core layer is disposed over the substrate, a resin layer is disposed over the core layer, and the grating and nanowells are disposed in the resin layer. The core layer is disposed over the substrate, the grating is disposed over the core layer, and the nanowell layer is disposed over the grating. A grating layer covers the core layer, the grating layer including the grating. The core layer is disposed over the substrate, a polymer layer is disposed over the core layer, and a resin layer is disposed over the polymer layer, wherein the grating is disposed in the polymer layer, and wherein the nanowells are disposed in the resin layer. A polymer layer is disposed over the substrate, and a resin layer is disposed over the polymer layer, wherein the grating is disposed in the polymer layer, and wherein the nanowells are disposed in the resin layer.

It should be appreciated that all combinations of the foregoing concepts and additional concepts discussed in greater detail below (provided such concepts are not mutually inconsistent) are contemplated as being part of the inventive subject matter disclosed herein and can achieve the benefits as described herein. In particular, all combinations of claimed subject matter appearing at the end of this disclosure are contemplated as being part of the inventive subject matter disclosed herein and can achieve the benefits as described herein.

DETAILED DESCRIPTION

Figure 1:
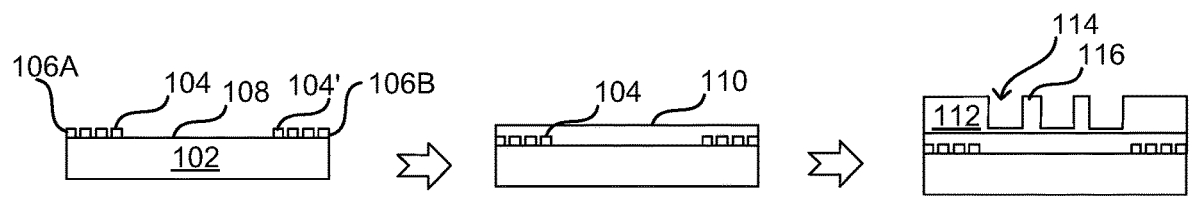
FIG. 1 shows an example of fabricating a planar waveguide.

The present disclosure describes systems, techniques, articles of manufacture, and/or compositions of matter that facilitate improved analysis of samples. Sample analysis can include, but is not limited to, genetic sequencing (e.g., determining the structure of genetic material), genotyping (e.g., determining differences in an individual's genetic make-up), gene expression (e.g., synthesizing a gene product using gene information), proteomics (e.g., large-scale study of proteins), or combinations thereof. A substrate for holding the sample(s) during analysis can be manufactured in a more efficient way, and/or can have improved characteristics, as described herein. In some implementations, a flowcell can have an improved architecture that facilitates efficient use of illuminating light to excite active elements (e.g., fluorophores) in the sample. For example, the architecture can include a core layer disposed between a substrate and a nanowell layer, and a grating to couple light (i.e., illuminating or exciting light) to the core layer. The materials of the flowcell architecture can be selected so that their respective refractive indices have advantageous proportions relative to each other. The core layer can facilitate that the illuminating light is efficiently used for exciting the sample. For example, the architecture can be based on the principles of total internal reflection (TIR) and can be designed so that evanescent light reaches the sample(s) in one or more dedicated areas (e.g., in a nanowell) in an efficient manner.

As scan speeds in sample analysis increase, and the corresponding data densities likewise increase, systems may be designed with higher levels of illumination (e.g., laser) power. This can result in higher costs for instrumentation. However, the damage to optics and the substrate (e.g., flowcell) can increase by such developments. Some implementations, such as those relating to planar waveguides, can be designed with an eye toward improving the excitation efficiency and/or reducing background noise. For example, a planar-waveguide flowcell can include a substrate (e.g., of glass), one or more light-coupling gratings, a high-refractive index core layer, and a water buffer or patterned polymer cladding layer. Improved fabrication techniques for such flowcells and/or the architectures thereof are described in the present disclosure.

Some examples described herein relate to sequencing of genetic material. Sequencing can be performed on a sample to determine which building blocks, called nucleotides, make up the particular genetic material that is in the sample. The sequencing can be done after the genetic material has first been purified and then replicated a number of times so as to prepare a sample of a suitable size.

Imaging can be performed as part of the process of analyzing sample material. This can involve fluorescent imaging, such as when a sample of genetic material is subjected to light (e.g., a laser beam) to trigger a fluorescent response by one or more markers on the genetic material. Some nucleotides of the genetic material can have fluorescent tags applied to them, which allows for determination of the presence of the nucleotide by shining light onto, and looking for a characteristic response from, the sample. Fluorescent responses can be detected over the course of the analysis process and used to build a record of nucleotides in the sample.

Examples described herein refer to flowcells. A flowcell is a substrate that can be used in preparing and accommodating or carrying one or more samples in at least one stage of an analysis process. The flowcell is made of a material that is compatible with both the genetic material, the illumination and the chemical reactions to which it will be exposed. The substrate can have one or more channels in which sample material can be deposited. A substance (e.g., a liquid) can be flowed through the channel where the sample genetic material is present to trigger one or more chemical reactions and/or to remove unwanted material. The flowcell may enable the imaging by facilitating that the sample in the flowcell channel can be subjected to illuminating light and that any fluorescent responses from the sample can be detected. Some implementations of the system may be designed to be used with at least one flowcell, but may not include the flowcell(s) during one or more stages, such as during shipping or when delivered to a customer. For example, the flowcell(s) can be installed into an implementation at the customer's premises in order to perform analysis.

Examples herein refer to coupling of light (e.g., a laser beam) into and/or out of a waveguide by one or more gratings. A grating can couple light impinging on the grating by way of diffracting at least a portion of the light, thereby causing the portion of the light to propagate in one or more other directions. In some implementations, the coupling can involve one or more interactions, including, but not limited to, reflection, refraction and/or transmission of the portion of the light. Implementations may be designed to meet one or more requirements, including, but not limited to, those regarding mass production, cost control, and/or high light coupling efficiency.

Providing a planar waveguide in a substrate (such as a flowcell) can provide one or more advantages. Excitation using evanescent light based on TIR can provide a higher efficiency of illumination. In some previous approaches, the entirety of a laser beam was used for illuminating the substrate that held the sample, such as in a scanning process. Such an approach may cause a majority of the light wave to propagate through the substrate without effectively illuminating the sample. As a result, only a small portion of the light applied by such systems may actually be used for exciting fluorophores in the sample. The evanescent light, by contrast, may penetrate material (e.g., a cladding adjacent the core layer) only to a certain depth (e.g., between about 150 and about 200 nm in one example, e.g., between about 165 nm and about 185 nm; In some examples, the depth can be about 155 nm, about 170 nm, about 180 nm, about 195 nm, etc.). For example, the flowcell can be designed with one or more nanowells configured so that the evanescent field is largely confined to the well area. As a result, evanescent light may be a very efficient way of exciting fluorophores. For example, a system operating according to an earlier illumination approach may require a laser with a certain power; using evanescent light, by contrast, a significantly lower laser power may be sufficient.

Examples described herein mention that one or more gratings can be provided for coupling of light. The gratings can be identical or similar to each other, or can be different types of gratings. The grating(s) can include one or more forms of periodic structure. In some implementations, the grating can be formed by removing or omitting material from a substrate (e.g., from a waveguide material that is included in the flowcell) or other material. For example, the flowcell can be provided with a set of slits and/or grooves therein to form the grating. In some implementations, the grating can be formed by adding matter to the flowcell (e.g., to a waveguide material that is included in the flowcell) or other material. For example, the flowcell can be provided with a set of ridges, bands or other protruding longitudinal structures to form the grating. Combinations of these approaches can be used.

Examples herein refer to photolithography. Photolithography-based approaches may involve use of a photoresist that is patterned with a stepper or mask aligner, exposed with radiation to transfer the pattern present on a reticle/photomask into the photoresist, and then developed to yield a structured film (photoresist) on top of the substrate. The structured resist may be the final substrate which can be used for subsequent core layer coating. As another example, the pattern in the resist can be transferred into a substrate or other material via additional processing. Follow on process operations may include reactive ion etching (plasma based dry etching) or a wet etch (chemically based) process. If the pattern is transferred into the substrate/material, the patterned photoresist is subsequently removed to yield the patterned substrate (e.g., for subsequent core layer coating). A sacrificial film of a material such as chromium or titanium or another metal under the photoresist, and first transfer the pattern in the photoresist to the metal film and then use that film as a hard mask by which the pattern is transferred into the substrate. After pattern transfer into the substrate, the films may be removed and hence be considered sacrificial to the fabrication process. One or more of a variety of materials may be applied in a photolithographic process. In some implementations, an oxide material is used. For example, $SiO_2$ (silicon dioxide) may be applied. A lift-off process may be similar to a pattern photoresist process: instead of removing material through dry etching or wet etching, one may deposit materials (e.g., $SiO_2$), followed by stripping off, which involves removing the photoresist together with the deposited materials on top of it. Grating structures can also or instead be formed.

Examples herein refer to sputtering. Sputter deposition may refer to a physical vapor deposition (PVD) method of depositing a thin film or coating deposition. Such processes may involve causing material to be ejected from a source and deposited onto a substrate. In some implementations, sputter deposition forms a thin layer of waveguide on the surface of a substrate. One or more of multiple materials may be used in sputtering. Waveguide materials used in sputter deposition may include metals and metal oxides with high refractive index and low adsorption characteristics. For example, a waveguide material may include tantalum pentoxide ($Ta_2O_5$) or a silicon nitride (e.g., one or more of the compounds referred to by the formula $SiN_x$, including, but not limited to, $Si_3N_4$). When the underlying surface is patterned, the waveguide layer/coating may adopt the patterns in the underlying surface, thus forming optical features on the surface of the substrate. Based on the design of the patterns, this may enable manipulation of the light on the substrate surface during downstream imaging processes.

Examples herein refer to chemical vapor deposition. Chemical vapor deposition (CVD) may include all techniques where a volatile material (sometimes referred to as a precursor) is caused to undergo reaction and/or decomposition on the surface of a substrate, forming a deposit thereon. CVD may be characterized by one or more aspects. For example, CVD may be characterized by the physical characteristic(s) of the vapor (e.g., whether the CVD is aerosol-assisted or involves direct liquid injection). For example, CVD may be characterized by the type of substrate heating (e.g., whether the substrate is directly heated or indirectly heated, such as by a heated chamber). Examples of types of CVD that can be used include, but are not limited to, atmospheric pressure CVD, low pressure CVD, very low pressure CVD, ultrahigh vacuum CVD, metalorganic CVD, laser assisted CVD, and plasma-enhanced CVD.

Examples herein refer to atomic layer deposition. Atomic layer deposition may be considered a form of CVD and include all techniques where a film is grown on a substrate by exposure to gases. For example, gaseous precursors may be alternatingly introduced into a chamber. The molecules of one of the precursors may react with the surface until a layer is formed and the reaction is terminated, and the next gaseous precursor may then be introduced to begin forming a new layer, and so on in one or more cycles.

Examples herein refer to spray coating. Spray coating may include any or all techniques by which a particularized material is caused to be deposited onto a substrate. This may include, but is not limited to, thermal spraying, plasma spraying, cold spraying, warm spraying, and/or other procedures involving atomized or nebulized material.

Examples herein refer to spin coating. Spin coating may include application of an amount of coating material to a substrate, and distributing or spreading the coating material over the substrate by way of centrifugal force due to rotation or spinning of the substrate.

Examples herein refer to nanoimprinting. In nanoimprinting lithography, a pre-fabricated nanoscale template may mechanically displace a fluidic resin to mold the desired nanostructures. The resin may then be cured with the nanoscale template in place. Following the removal of the nanoscale template, a molded solid resin attached to a desired substrate may be produced. In some implementations, a nanoimprinting process may begin with fully or partially covering a substrate or wafer with imprinting resin (e.g., a resin as exemplified below). One or more nanostructures may be formed in the imprinting resin in a molding process using a nanoscale template. The imprinting resin can be cured against the substrate or wafer, and a resin-removal process can be applied to remove residue from the wafer or substrate. For example, the resin removal can form chamber lanes adjacent the nanostructures. The substrate or wafer so formed can have another substrate or a gasket applied thereto so as to form a flowcell having the described nanostructures as well as flowcell chambers formed by enclosing the chamber lanes. In some implementations, the process of applying the imprinting resin may be configured to produce little or no resin residue, and in such implementations a resin-removal process can be omitted. In some applications, the cured resin may also be functionalized with a chemical treatment or an attachment of biomolecules, depending on the end use. In nanoimprinting lithography, an imprinted photoresist can be a sacrificial material and similarly be used as an intermediate tool to transfer the patterned resist into the substrate or a variation of the resist can be used such that the imprinted resist serves as the input to a subsequent coating process. An example of a resist that would remain following patterning is material formed by a process that involves conversion of monomers into a colloidal solution as a precursor to a gel of particles and/or polymers, sometimes referred to as a sol-gel based material.

Examples described herein mention that one or more resins may be used. Any suitable resin may be used for nanoimprinting in methods described herein. In some implementations, an organic resin may be used, including, but not limited to, an acrylic resin, a polyimide resin, a melamine resin, a polyester resin, a polycarbonate resin, a phenol resin, an epoxy resin, polyacetal resin, polyether resin, polyurethane resin, polyamide resin (and/or nylon), a furan resin, a diallylphthalate resin, or combinations thereof. In some examples, a resin may include an inorganic siloxane polymer including a Si—O—Si bond among compounds (including silicon, oxygen, and hydrogen), and formed by using a siloxane polymer-based material typified by silica glass as a starting material. A resin used may also or instead be an organic siloxane polymer in which hydrogen bonded to silicon is substituted by an organic group, such as methyl or phenyl, and typified by an alkylsiloxane polymer, an alkylsilsesquioxane polymer, a silsesquioxane hydride polymer, or an alkylsilsesquioxane hydride polymer. Non-limiting examples of siloxane polymers include polyhedral oligomeric silsesquioxane (POSS), polydimethylsiloxane (PDMS), tetraethyl ortho silicate (TEOS), poly (organo) siloxane (silicone), and perfluoropolyether (PFPE). An example of POSS can be that described in Kehagias et al. Microelectronic Engineering 86 (2009), pp. 776-778, which is hereby incorporated by reference in its entirety. A resin may be doped with a metal oxide. In some implementations, a resin may be a sol-gel material including, but not limited to, titanium oxide, hafnium oxide, zirconium oxide, tin oxide, zinc oxide, or germanium oxide, and that uses a suitable solvent. Any one of a number of other resins may be employed, as appropriate to the application.

Examples herein refer to substrates. A substrate may refer to any material that provides a substantially rigid structure, or to a structure that retains its shape rather than taking on the shape of a vessel to which it is placed in contact. The material can have a surface to which another material can be attached including, for example, smooth supports (e.g., metal, glass, plastic, silicon, and ceramic surfaces), as well as textured and/or porous materials. Possible substrates include, but are not limited to, glass and modified or functionalized glass, plastics (including acrylics, polystyrene and copolymers of styrene and other materials, polypropylene, polyethylene, polybutylene, polyurethanes, Teflon™, etc.), polysaccharides, nylon or nitrocellulose, resins, silica or silica-based materials including silicon and modified silicon, carbon, metals, inorganic glasses, plastics, optical fiber bundles, and a variety of other polymers. In general, the substrates allow optical detection and do not themselves appreciably fluoresce.

Examples herein refer to polymers. A polymer layer can include a film of a polymer material. Exemplary film forming polymers include, without limitation, acrylamide or copolymers with C1-C12; aromatic and hydroxyl derivatives; acrylate copolymers; vinylpyrrolidine and vinylpyrrolidone copolymers; sugar based polymers such as starch or polydextrins; or other polymers such as polyacrylic acid, polyethylene glycol, polylactic acid, silicone, siloxanes, polyethyleneamines, guar gum, carrageenan, alginate, lotus bean gum, methacrylate co polymers, polyimide, a cyclic olefin copolymer, or combinations thereof. In some implementations, a polymer layer comprises at least one photocurable polymer. For example, a photocurable polymer can include urethane, acrylate, silicone, epoxy, polyacrylic acid, polyacrylates, epoxysilicone, epoxy resins, polydimethylsiloxane (PDMS), silsesquioxane, acyloxysilanes, maleate polyesters, vinyl ethers, monomers with vinyl or ethynyl groups, or copolymers, or combinations thereof. In some implementations, a layer can include a covalently attached polymer coating. For example, this can include a polymer coating that forms chemical bonds with a functionalized surface of a substrate, as compared to attachment to the surface in other ways, for example, adhesion or electrostatic interaction. In some implementations, a polymer comprised in a functionalizable layer is poly(N-(5-azidoacetamidylpentyl) acrylamide-co-acrylamide), sometimes referred to as PAZAM.

Figure 2:
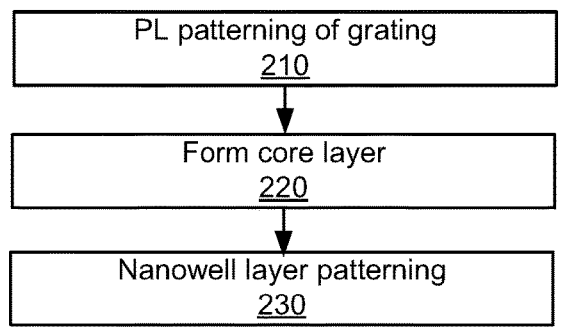
FIG. 2 shows a method of manufacturing a planar waveguide relating to the planar waveguide in FIG. 1.

FIG. 1 shows an example of fabricating a planar waveguide 100. The planar waveguide 100 can be used in one or more examples described herein. For example, the planar waveguide 100 can accommodate one or more samples to facilitate illumination and excitation during sample analysis. FIG. 2 shows a method 200 of manufacturing a planar waveguide relating to the planar waveguide in FIG. 1. The method 200 can be combined with one or more other methods described herein. More or fewer operations can be performed, and/or two or more operations can be performed in a different order, unless otherwise indicated.

At 210, a photolithographic (PL) patterning of a grating can be performed. In some implementations, a substrate 102 is provided with one or more gratings 104. For example, the grating 104 can be a laser-coupling grating. In some implementations, the photolithographic patterning can include a deposition or etching process. For example, an oxide (e.g., $SiO_2$) can be patterned. The grating 104 is here shown in a longitudinal direction so that each of respective ridges 104' extends into the plane of illustration. The grating 104 can include several of the ridges 104', for example organized in respective groups 106A and 106B. For example, the groups 106A-106B can be positioned so as to leave an area 108 of the substrate 102 substantially free of the grating(s) 104. The ridges 104' can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc.

At 220, a core layer can be formed. In some implementations, a core layer 110 is formed at the substrate 102. In some implementations, the core layer 110 is formed at the grating 104. In some implementations, the substrate 102 can serve as a cladding for the core layer 110. The core layer 110 may have a higher refractive index than the substrate 102. For example, the substrate 102 may have a refractive index of about 1.5, and the core layer may have a refractive index of about 2.2, or in the range from above about 1.5 to about 2.2, e.g., from about 1.6 to about 2.1. In some examples, the refractive index can be about 1.65, about 1.85, about 2.05, etc. The core layer 110 may cover substantially the entire facing surface of the substrate 102. The core layer 110 may have a higher refractive index than the grating 104. In some implementations, the core layer 110 includes $Ta_2O_5$ and/or $SiN_x$. For example, the core layer 110 can be formed by sputtering, chemical vapor deposition, atomic layer deposition, spin coating, and/or spray coating.

At 230, nanowell layer patterning is performed. In some implementations, a nanowell layer 112 is formed at the core layer 110. The nanowell layer 112 can facilitate a patterned flowcell. The nanowell layer 112 can include one or more nanowells 114 defined between two or more walls 116. In some implementations, the nanowell 114 can have a size such that one or more of its dimensions ranges in the order of about one or more nanometers. For example, the nanowell(s) 114 can be configured for receiving and holding the sample(s) during the analysis process, such as in form of clusters. An end (e.g., the bottom) of the nanowell 114 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. The nanowell layer 112 can be formed by a nanoimprinting process or a lift-off process. In some implementations, the nanowell layer 112 can include one or more resins. The nanowell layer can cover substantially the entire facing surface of the core layer 110. For example, the resin can have a refractive index of about 1.5. In some implementations, the nanowell layer 112 can have an average pitch between the nanowells 114 of at least about 10 nm, about 0.1 μm, about 0.5 μm, about 1 μm, about 5 μm, about 10 μm, about 100 μm or more, and/or can have an average pitch of at most about 100 μm, about 10 μm, about 5 μm, about 1 μm, about 0.5 μm, about 0.1 μm or less. For example, the nanowell layer 112 can have a pitch between the nanowells 114 of about 600 to about 650 nm, e.g., the pitch can be about 610 nm to about 640 nm. In some examples, the pitch can be about 605 nm, about 615 nm, about 635 nm, about 655 nm, etc. The depth of each nanowell 114 can be at least about 0.1 μm, about 1 μm, about 10 μm, about 100 μm or more. Alternatively or additionally, the depth can be at most about $1 \times 10^3$ μm, about 100 μm, about 10 μm, about 1 μm, about 0.1 μm or less.

Figure 3:
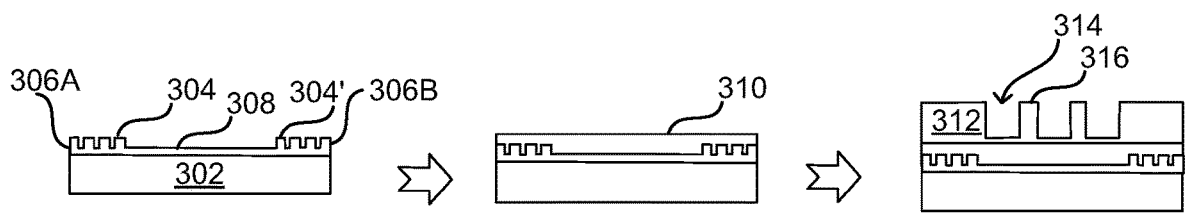
FIG. 3 shows an example of fabricating a planar waveguide.
Figure 4:
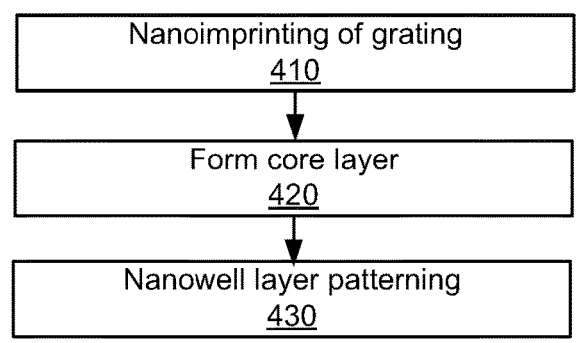
FIG. 4 shows a method of manufacturing a planar waveguide relating to the planar waveguide in FIG. 3.

FIG. 3 shows an example of fabricating a planar waveguide 300. The planar waveguide 300 can be used in one or more examples described herein. For example, the planar waveguide 300 can accommodate one or more samples to facilitate illumination and excitation during sample analysis. FIG. 4 shows a method 400 of manufacturing a planar waveguide relating to the planar waveguide in FIG. 3. The method 400 can be combined with one or more other methods described herein. More or fewer operations can be performed, and/or two or more operations can be performed in a different order, unless otherwise indicated.

At 410, a nanoimprinting of a grating can be performed. In some implementations, a substrate 302 is provided with one or more grating layers 304. For example, the grating layer 304 can include a laser-coupling grating. For example, a resin can be nanoimprinted. The grating layer 304 is here shown in a longitudinal direction so that each of respective ridges 304' extends into the plane of illustration. The grating layer 304 can include several of the ridges 304', for example organized in respective groups 306A and 306B. For example, the groups 306A-306B can be separated by an area 308 of the grating layer 304 that also covers the surface of the substrate 302. The area 308 can form a thin residual layer at the surface of the substrate 302. The ridges 304' can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc. Applying the grating layer 304 by a nanoimprinting process can provide one or more advantages. In some implementations, nanoimprinting may be compatible with an existing flowcell fabrication process. For example, this can reduce the substrate fabrication cost.

At 420, a core layer can be formed. In some implementations, a core layer 310 is formed at the substrate 302. In some implementations, the core layer 310 is formed at the grating layer 304. In some implementations, the grating layer 304 can serve as a cladding for the core layer 310. The core layer 310 may have a higher refractive index than the substrate 302. For example, the substrate 302 may have a refractive index of about 1.5, and the core layer may have a refractive index of about 2.2, or in the range from above about 1.5 to about 2.2, e.g., from about 1.6 to about 2.1. In some examples, the refractive index can be about 1.65, about 1.85, about 2.05, etc. The core layer 310 may cover substantially the entire facing surface of the grating layer 304. The core layer 310 may have a higher refractive index than the grating layer 304. In some implementations, the core layer 310 includes $Ta_2O_5$ and/or $SiN_x$. For example, the core layer 310 can be formed by sputtering, chemical vapor deposition, atomic layer deposition, spin coating, and/or spray coating.

At 430, nanowell layer patterning is performed. In some implementations, a nanowell layer 312 is formed at the core layer 310. The nanowell layer 312 can facilitate a patterned flowcell. The nanowell layer 312 can include one or more nanowells 314 defined between two or more walls 316. In some implementations, the nanowell 314 can have a size such that one or more of its dimensions ranges in the order of about one or more nanometers. For example, the qjnanowell(s) 314 can be configured for receiving and holding the sample(s) during the sample analysis process, such as in form of clusters. An end (e.g., the bottom) of the nanowell 314 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. The nanowell layer 312 can be formed by a nanoimprinting process or a lift-off process. In some implementations, the nanowell layer 312 can include one or more resins. The nanowell layer can cover substantially the entire facing surface of the core layer 310. For example, the resin can have a refractive index of about 1.5. In some implementations, the nanowell layer 312 can have an average pitch between the nanowells 314 of at least about 10 nm, about 0.1 μm, about 0.5 μm, about 1 μm, about 5 μm, about 10 μm, about 100 μm or more, and/or can have an average pitch of at most about 100 μm, about 10 μm, about 5 μm, about 1 μm, about 0.5 μm, about 0.1 μm or less. For example, the nanowell layer 312 can have a pitch between the nanowells 314 of about 600 to about 650 nm, e.g., the pitch can be about 610 nm to about 640 nm. In some examples, the pitch can be about 605 nm, about 615 nm, about 635 nm, about 655 nm, etc. The depth of each nanowell 314 can be at least about 0.1 μm, about 1 μm, about 10 μm, about 100 μm or more. Alternatively or additionally, the depth can be at most about $1 \times 10^3$ µm, about 100 µm, about 10 µm, about 1 µm, about 0.1 µm or less.

Figure 5:
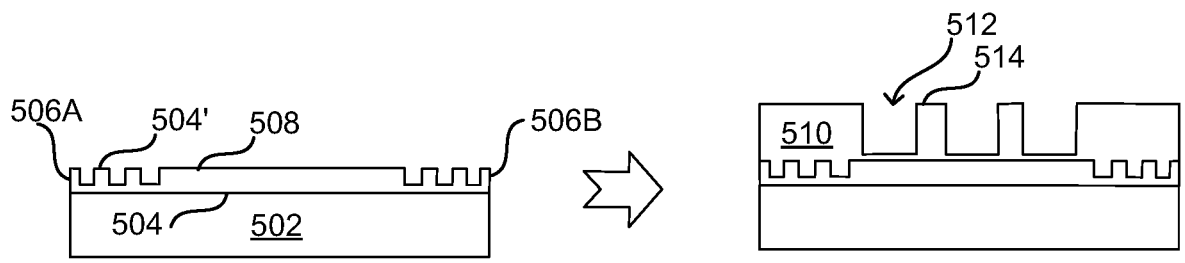
FIG. 5 shows an example of fabricating a planar waveguide.
Figure 6:
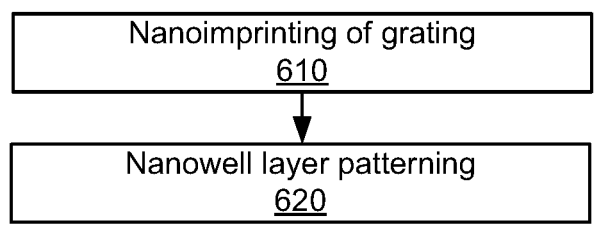
FIG. 6 shows a method of manufacturing a planar waveguide relating to the planar waveguide in FIG. 5.

FIG. 5 shows an example of fabricating a planar waveguide 500. The planar waveguide 500 can be used in one or more examples described herein. For example, the planar waveguide 500 can accommodate one or more samples to facilitate illumination and excitation during sample analysis. FIG. 6 shows a method 600 of manufacturing a planar waveguide relating to the planar waveguide in FIG. 5. The method 600 can be combined with one or more other methods described herein. More or fewer operations can be performed, and/or two or more operations can be performed in a different order, unless otherwise indicated.

At 610, a nanoimprinting of a grating in a core layer can be performed. In some implementations, a substrate 502 is provided with one or more core layers 504. For example, the core layer 504 can include a laser-coupling grating. For example, a resin can be nanoimprinted. The core layer 504 is here shown in a longitudinal direction so that each of respective ridges 504' extends into the plane of illustration. The core layer 504 can include several of the ridges 504', for example organized in respective groups 506A and 506B. For example, the groups 506A-506B can be separated by an area 508 of the core layer 504 that also covers the surface of the substrate 502. The ridges 504' can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc. For example, the substrate 502 may have a refractive index of about 1.5, and the core layer 504 may have a refractive index of higher than about 1.5. For example, the core layer 504 can be made from a high-refractive index polymer material. The core layer 504 may cover substantially the entire facing surface of the substrate 502.

At 620, nanowell layer patterning is performed. In some implementations, a nanowell layer 510 is formed at the core layer 504. The nanowell layer 510 can facilitate a patterned flowcell. In some implementations, the nanowell layer 510 and the substrate 502 can serve as cladding for the core layer 504. The nanowell layer 510 can include one or more nanowells 512 defined between two or more walls 514. In some implementations, the nanowell 512 can have a size such that one or more of its dimensions ranges in the order of about one or more nanometers. For example, the nanowell(s) 512 can be configured for receiving and holding the sample(s) during the analysis process, such as in form of clusters. An end (e.g., the bottom) of the nanowell 512 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. The nanowell layer 510 can be formed by a nanoimprinting process or a lift-off process. In some implementations, the nanowell layer 510 can include one or more resins. For example, the resin can have a refractive index of about 1.5. In some implementations, the nanowell layer 510 can have an average pitch between the nanowells 512 of at least about 10 nm, about 0.1 µm, about 0.5 µm, about 1 µm, about 5 µm, about 10 µm, about 100 µm or more, and/or can have an average pitch of at most about 100 µm, about 10 µm, about 5 µm, about 1 µm, about 0.5 µm, about 0.1 µm or less. For example, the nanowell layer can cover substantially the entire facing surface of the core layer 504. The nanowell layer 510 can have a pitch between the nanowells 512 of about 600 to about 650 nm, e.g., the pitch can be about 610 nm to about 640 nm. In some examples, the pitch can be about 605 nm, about 615 nm, about 635 nm, about 655 nm, etc. The depth of each nanowell 512 can be at least about 0.1 µm, about 1 µm, about 10 µm, about 100 µm or more. Alternatively or additionally, the depth can be at most about $1 \times 10^3$ µm, about 100 µm, about 10 µm, about 1 µm, about 0.1 µm or less.

Figure 7:
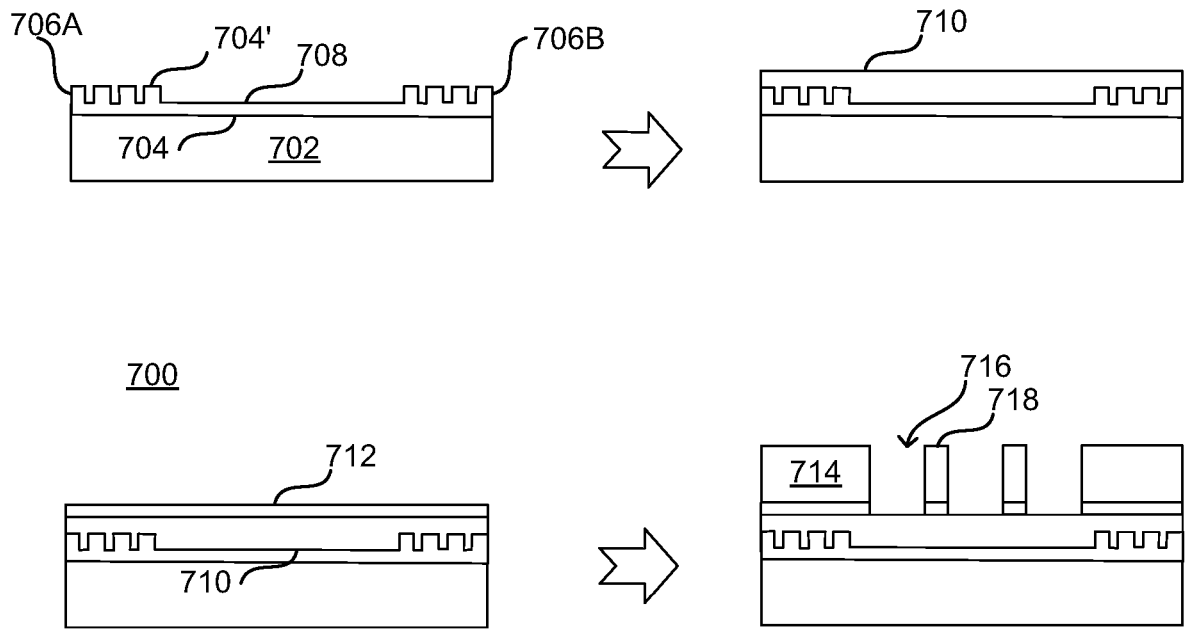
FIG. 7 shows an example of fabricating a planar waveguide.
Figure 8:
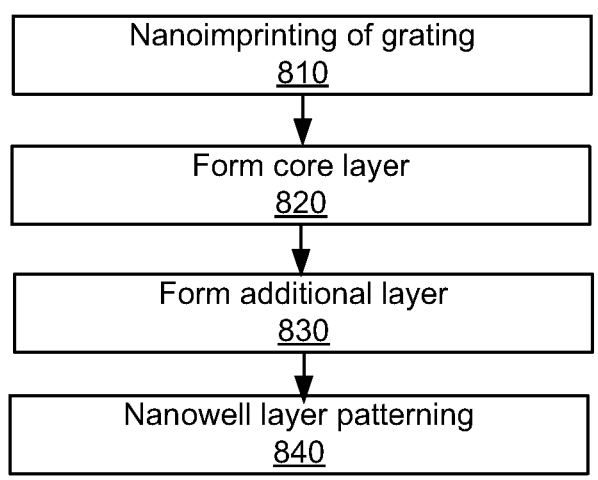
FIG. 8 shows a method of manufacturing a planar waveguide relating to the planar waveguide in FIG. 7.

FIG. 7 shows an example of fabricating a planar waveguide 700. The planar waveguide 700 can be used in one or more examples described herein. For example, the planar waveguide 700 can accommodate one or more samples to facilitate illumination and excitation during sample analysis. FIG. 8 shows a method 800 of manufacturing a planar waveguide relating to the planar waveguide in FIG. 7. The method 800 can be combined with one or more other methods described herein. More or fewer operations can be performed, and/or two or more operations can be performed in a different order, unless otherwise indicated.

At 810, a nanoimprinting of a grating can be performed. In some implementations, a substrate 702 is provided with one or more grating layers 704. For example, the grating layer 704 can include a laser-coupling grating. For example, a resin can be nanoimprinted. The grating layer 704 is here shown in a longitudinal direction so that each of respective ridges 704' extends into the plane of illustration. The grating layer 704 can include several of the ridges 704', for example organized in respective groups 706A and 706B. For example, the groups 706A-706B can be separated by an area 708 of the grating layer 704 that also covers the surface of the substrate 702. The area 708 can form a thin residual layer at the surface of the substrate 702. The ridges 704' can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc. Applying the grating layer 704 by a nanoimprinting process can provide one or more advantages. In some implementations, nanoimprinting may be compatible with an existing flowcell fabrication process. For example, this can reduce the substrate fabrication cost.

At 820, a core layer can be formed. In some implementations, a core layer 710 is formed at the grating layer 704. In some implementations, the grating layer 704 can serve as a cladding for the core layer 710. The core layer 710 may have a higher refractive index than the substrate 702. For example, the substrate 702 may have a refractive index of about 1.5, and the core layer may have a refractive index of about 2.2, or in the range from above about 1.5 to about 2.2, e.g., from about 1.6 to about 2.1. In some examples, the refractive index can be about 1.65, about 1.85, about 2.05, etc. The core layer 710 may cover substantially the entire facing surface of the grating layer 704. The core layer 710 may have a higher refractive index than the grating layer 704. In some implementations, the core layer 710 includes $Ta_2O_5$ and/or $SiN_x$, or a polymer material. For example, the core layer 710 can be formed by sputtering, chemical vapor deposition, atomic layer deposition, spin coating, and/or spray coating.

At 830, an additional layer can be formed. In some implementations, a layer 712 is formed at the core layer 710. The layer 712 may be formed by sputtering, chemical vapor deposition, atomic layer deposition, spin coating, and/or spray coating, to name just a few examples. The layer 712 has a lower refractive index than the core layer 710. In some implementations, the layer 712 is formed from a polymer material having a refractive index similar to that of water-based reagent, such as about 1.35. For example, the layer 712 can include, but is not limited to, a transparent, electrically insulating, water and oil repellent, and/or chemically resistant, fluoropolymer. The layer 712 can have a thickness of about 100 to about 200 nm, to name just one example, e.g., the thickness can be about 120 nm to about 180 nm. In some examples, the thickness can be about 105 nm, about 115 nm, about 135 nm, about 165 nm, about 195 nm, etc.

At 840, nanowell layer patterning is performed. In some implementations, a nanowell layer 714 is formed at the layer 712. The nanowell layer 714 can facilitate a patterned flowcell. The nanowell layer 714 can include one or more nanowells 716 defined between two or more walls 718. In some implementations, the nanowell 716 can have a size such that one or more of its dimensions ranges in the order of about one or more nanometers. For example, the nanowell(s) 716 can be configured for receiving and holding the sample(s) during the analysis process, such as in form of clusters. An end (e.g., the bottom) of the nanowell 716 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. The nanowell layer 714 can be formed by a nanoimprinting process or a lift-off process. In some implementations, the nanowell layer 714 can include one or more resins. The nanowell layer can cover substantially the entire facing surface of the layer 712. For example, the resin can have a refractive index of about 1.5. In some implementations, the nanowell layer 714 can have an average pitch between the nanowells 716 of at least about 10 nm, about 0.1 μm, about 0.5 μm, about 1 μm, about 5 μm, about 10 μm, about 100 μm or more, and/or can have an average pitch of at most about 100 μm, about 10 μm, about 5 μm, about 1 μm, about 0.5 μm, about 0.1 μm or less. For example, the nanowell layer 714 can have a pitch between the nanowells 716 of about 600 to about 650 nm, e.g., the pitch can be about 610 nm to about 640 nm. In some examples, the pitch can be about 605 nm, about 615 nm, about 635 nm, about 655 nm, etc. The depth of each nanowell 716 can be at least about 0.1 μm, about 1 μm, about 10 μm, about 100 μm or more. Alternatively or additionally, the depth can be at most about $1 \times 10^3$ μm, about 100 μm, about 10 μm, about 1 μm, about 0.1 μm or less.

Having the layer 712 between the core layer 710 and the nanowell layer 714 can provide one or more advantages. In some implementations, during sample analysis the planar waveguide 700 is submerged in water-based reagent, which may have a relatively low refractive index, such as about 1.35. The nanowell layer 714 may have a refractive index of about 1.5, which can be a less than ideal match with the water-based reagent if the layer 712 were not present. For example, scattering or other photonic crystal effects can occur with a mismatch of refractive indices. However, the layer 712 can provide a relatively lower refractive index than other materials. Evanescent light may have only a certain penetrating depth, such as about 150 to about 200 nm, e.g., between about 165 nm and about 185 nm; In some examples, the depth can be about 155 nm, about 170 nm, about 180 nm, about 195 nm, etc. Thus, the thickness of the layer 712 can be controlled so that the evanescent light encounters only the layer 712 and the water-based reagent in the nanowells 716. That is, the evanescent light may not (substantially) reach the nanowell layer 714. This can avoid or reduce unwanted effects such as scattering.

The pattern of the nanowell layer 714 can be transferred into the layer 712. In some implementations, the layer 712 may be formed so as to cover substantially the entire surface of the core layer 710. The nanowell layer 714 may be formed at the layer 712. Thereafter, the nanowell layer 714 may be imprinted with the nanowells 716. The nanoimprinting process may not penetrate or perforate the layer 712; rather, the layer 712 may remain essentially intact after the nanoimprinting. Thereafter, etching (e.g., reactive-ion etching) can be performed to remove portions of the layer 712 at the end (e.g., the bottom) of the nanowells 716. Thus, the pattern of the nanowells 716 can be transferred to the layer 712.

Figure 9:
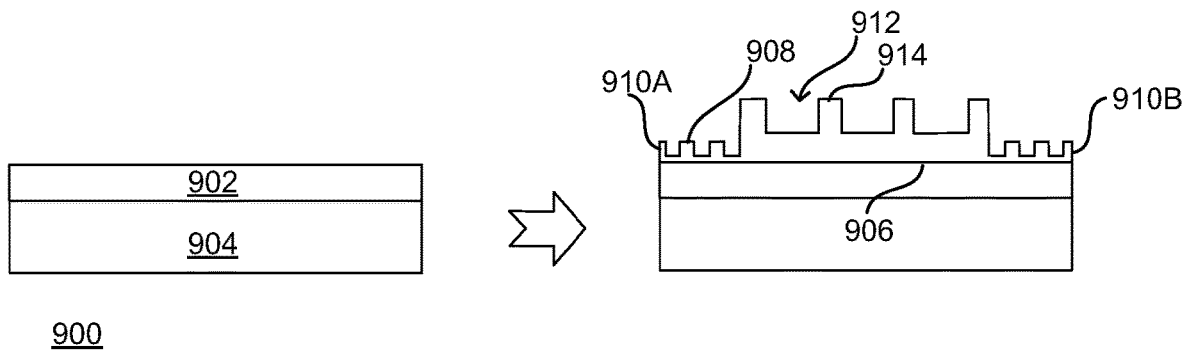
FIG. 9 shows an example of fabricating a planar waveguide.
Figure 10:
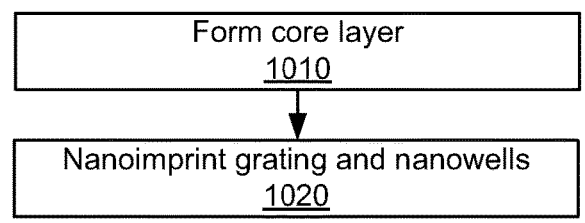
FIG. 10 shows a method of manufacturing a planar waveguide relating to the planar waveguide in FIG. 9.

FIG. 9 shows an example of fabricating a planar waveguide 900. The planar waveguide 900 can be used in one or more examples described herein. For example, the planar waveguide 900 can accommodate one or more samples to facilitate illumination and excitation during sample analysis. FIG. 10 shows a method 1000 of manufacturing a planar waveguide relating to the planar waveguide in FIG. 9. The method 1000 can be combined with one or more other methods described herein. More or fewer operations can be performed, and/or two or more operations can be performed in a different order, unless otherwise indicated.

At 1010, a core layer can be formed. In some implementations, a core layer 902 is formed at a substrate 904. In some implementations, the substrate 904 can serve as a cladding for the core layer 902. The core layer 902 may have a higher refractive index than the substrate 904. For example, the substrate 904 may have a refractive index of about 1.5, and the core layer may have a refractive index higher than about 1.5. The core layer 902 may cover substantially the entire facing surface of the substrate 904. In some implementations, the core layer 902 includes $Ta_2O_5$ and/or $SiN_x$, or a polymer material. For example, the core layer 902 can be formed by sputtering, chemical vapor deposition, atomic layer deposition, spin coating, and/or spray coating. In some implementations, the core layer 902 includes a high-refractive index polymer material, such as a resin. For example, a polymer can be spin coated to form the core layer 902.

At 1020, nanoimprinting of a grating and nanowells is performed. In some implementations, a layer 906 is formed at the core layer 902. The layer 906 can cover substantially the entire facing surface of the core layer 902. The layer 906 can facilitate a patterned flowcell and laser coupling by grating. For example, a resin can be nanoimprinted. The layer 906 is here shown in a longitudinal direction so that each of respective ridges 908 extends into the plane of illustration. The layer 906 can include several of the ridges 908, for example organized in respective groups 910A and 910B. For example, the groups 910A-910B can be respective input and output gratings for laser light. The ridges 908 can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc.

The layer 906 can include one or more nanowells 912 defined between two or more walls 914. In some implementations, the nanowell 912 can have a size such that one or more of its dimensions ranges in the order of about one or more nanometers. For example, the nanowell(s) 912 can be configured for receiving and holding the sample(s) during the analysis process, such as in form of clusters. An end (e.g., the bottom) of the nanowell 912 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. In some implementations, the layer 906 can have an average pitch between the nanowells 912 of at least about 10 nm, about 0.1 μm, about 0.5 μm, about 1 μm, about 5 μm, about 10 μm, about 100 μm or more, and/or can have an average pitch of at most about 100 μm, about 10 μm, about 5 μm, about 1 μm, about 0.5 μm, about 0.1 μm or less. For example, the nanowells 912 can have a pitch of about 600 to about 650 nm, e.g., the pitch can be about 610 nm to about 640 nm. In some examples, the pitch can be about 605 nm, about 615 nm, about 635 nm, about 655 nm, etc. The depth of each nanowell 912 can be at least about 0.1 μm, about 1 μm, about 10 μm, about 100 μm or more. Alternatively or additionally, the depth can be at most about $1 \times 10^3$ μm, about 100 μm, about 10 μm, about 1 μm, about 0.1 μm or less. For example, the layer 906 can be formed from a resin having a refractive index of about 1.5.

Forming the ridges 908 of the gratings, and the nanowells 912, in the layer 906 can involve nanoimprinting to more than one depth in the layer 906. In some implementations, a dual-depth stamp can be used in the nanoimprinting process. For example, the ridges 908 can be formed at a relatively greater depth in the layer 906 than the nanowells 912.

Figure 11:
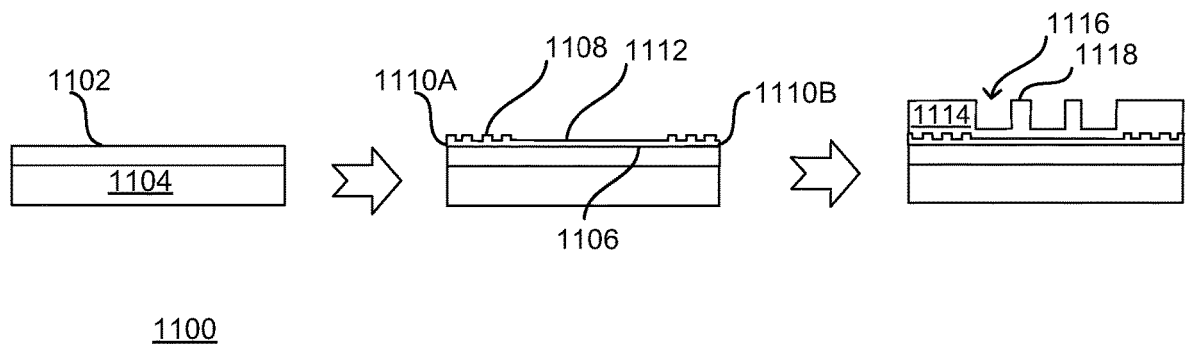
FIG. 11 shows an example of fabricating a planar waveguide.
Figure 12:
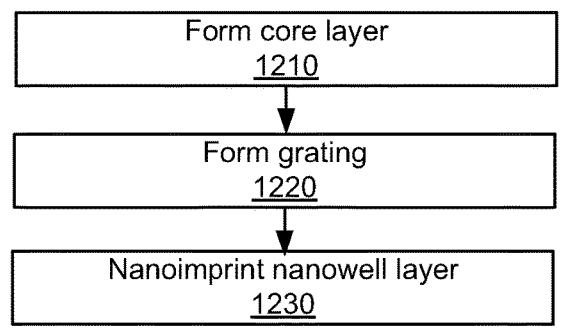
FIG. 12 shows a method of manufacturing a planar waveguide relating to the planar waveguide in FIG. 11.

FIG. 11 shows an example of fabricating a planar waveguide 1100. The planar waveguide 1100 can be used in one or more examples described herein. For example, the planar waveguide 1100 can accommodate one or more samples to facilitate illumination and excitation during sample analysis. FIG. 12 shows a method 1200 of manufacturing a planar waveguide relating to the planar waveguide in FIG. 11. The method 1200 can be combined with one or more other methods described herein. More or fewer operations can be performed, and/or two or more operations can be performed in a different order, unless otherwise indicated.

At 1210, a core layer can be formed. In some implementations, a core layer 1102 is formed at a substrate 1104. In some implementations, the substrate 1104 can serve as a cladding for the core layer 1102. The core layer 1102 may have a higher refractive index than the substrate 1104. For example, the substrate 1104 may have a refractive index of about 1.5, and the core layer may have a refractive index higher than about 1.5. The core layer 1102 may cover substantially the entire facing surface of the substrate 1104. In some implementations, the core layer 1102 includes $Ta_2O_5$, $SiN_x$, a polymer material, or combinations thereof. For example, the core layer 1102 can be formed by sputtering, chemical vapor deposition, atomic layer deposition, spin coating, and/or spray coating. In some implementations, the core layer 1102 includes a high-refractive index polymer material, such as a resin. For example, a polymer can be spin coated to form the core layer 1102.

At 1220, a nanoimprinting of a grating can be performed. In some implementations, the core layer 1102 is provided with one or more grating layers 1106. For example, the grating layer 1106 can include a laser-coupling grating. For example, a resin can be nanoimprinted. The grating layer 1106 is here shown in a longitudinal direction so that each of respective ridges 1108 extends into the plane of illustration. The grating layer 1106 can include several of the ridges 1108, for example organized in respective groups 1110A and 1110B. For example, the groups 1110A-1110B can be separated by an area 1112 of the grating layer 1106 that also covers the surface of the substrate 1104. The area 1112 can form a thin residual layer at the surface of the substrate 1104. The ridges 1108 can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc. Applying the grating layer 1106 by a nanoimprinting process can provide one or more advantages. In some implementations, nanoimprinting may be compatible with an existing flowcell fabrication process. For example, this can reduce the substrate fabrication cost.

At 1230, nanoimprinting of a nanowell layer is performed. In some implementations, a nanowell layer 1114 is formed at the grating layer 1106. The nanowell layer 1114 can facilitate a patterned flowcell. The nanowell layer 1114 can include one or more nanowells 1116 defined between two or more walls 1118. In some implementations, the nanowell 1116 can have a size such that one or more of its dimensions ranges in the order of about one or more nanometers. For example, the nanowell(s) 1116 can be configured for receiving and holding the sample(s) during the analysis process, such as in form of clusters. An end (e.g., the bottom) of the nanowell 1116 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. The nanowell layer 1114 can be formed by a nanoimprinting process or a lift-off process. In some implementations, the nanowell layer 1114 can include one or more resins. The nanowell layer can cover substantially the entire facing surface of the grating layer 1106. In some implementations, the nanowell layer 1114 can have an average pitch between the nanowells 1116 of at least about 10 nm, about 0.1 μm, about 0.5 μm, about 1 μm, about 5 μm, about 10 μm, about 100 μm or more, and/or can have an average pitch of at most about 100 μm, about 10 μm, about 5 μm, about 1 μm, about 0.5 μm, about 0.1 μm or less. For example, the nanowell layer 1114 can have a pitch between the nanowells 1116 of about 600 to about 650 nm, to name just one example, e.g., the pitch can be about 610 nm to about 640 nm. In some examples, the pitch can be about 605 nm, about 615 nm, about 635 nm, about 655 nm, etc. The depth of each nanowell 1116 can be at least about 0.1 μm, about 1 μm, about 10 μm, about 100 μm or more. Alternatively or additionally, the depth can be at most about $1 \times 10^3$ μm, about 100 μm, about 10 μm, about 1 μm, about 0.1 μm or less.

Forming the grating layer 1106 at the core layer 1102 can provide one or more advantages. In some implementations, the core layer 1102 can be pre-formed (e.g., by pre-sputtering) on the substrate 1104 before delivery to a facility (e.g., the fabrication plant of a flowcell manufacturer), and the remainder of the planar waveguide 1100 can then be formed (e.g., by nanoimprinting) without further transfer of the planar waveguide 1100 from that facility.

The grating layer 1106 can have a higher refractive index than one or more other materials. In some implementations, the grating layer 1106 has a refractive index that is higher than that of the core layer 1102. In some implementations, the core layer 1102 has a refractive index that is higher than that of the nanowell layer 1114. For example, the refractive index of the grating layer 1106 can be higher than the refractive index of the nanowell layer 1114.

Figure 13:
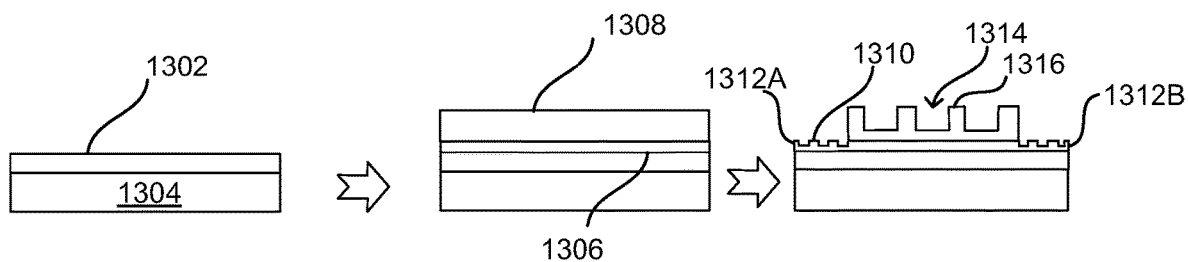
FIG. 13 shows an example of fabricating a planar waveguide.
Figure 14:
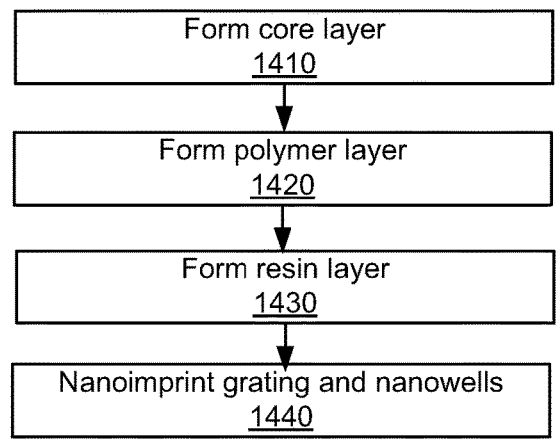
FIG. 14 shows a method of manufacturing a planar waveguide relating to the planar waveguide in FIG. 13.

FIG. 13 shows an example of fabricating a planar waveguide 1300. The planar waveguide 1300 can be used in one or more examples described herein. For example, the planar waveguide 1300 can accommodate one or more samples to facilitate illumination and excitation during sample analysis. FIG. 14 shows a method 1400 of manufacturing a planar waveguide relating to the planar waveguide in FIG. 13. The method 1400 can be combined with one or more other methods described herein. More or fewer operations can be performed, and/or two or more operations can be performed in a different order, unless otherwise indicated.

At 1410, a core layer can be formed. In some implementations, a core layer 1302 is formed at a substrate 1304. In some implementations, the substrate 1304 can serve as a cladding for the core layer 1302. The core layer 1302 may have a higher refractive index than the substrate 1304. For example, the substrate 1304 may have a refractive index of about 1.5, and the core layer may have a refractive index higher than about 1.5. The core layer 1302 may cover substantially the entire facing surface of the substrate 1304. In some implementations, the core layer 1302 includes $Ta_2O_5$ and/or $SiN_x$, or a polymer material. For example, the core layer 1302 can be formed by sputtering, chemical vapor deposition, atomic layer deposition, spin coating, and/or spray coating. In some implementations, the core layer 1302 includes a high-refractive index polymer material, such as a resin. For example, a polymer can be spin coated to form the core layer 1302.

At 1420, a polymer layer can be formed. In some implementations, a polymer layer 1306 is formed at the core layer 1302. The polymer layer 1306 may be formed by sputtering, chemical vapor deposition, atomic layer deposition, spin coating, and/or spray coating, to name just a few examples. The polymer layer 1306 has a lower refractive index than the core layer 1302. The polymer layer 1306 can have a thickness of about 100 to about 200 nm, to name just one example, e.g., the thickness can be about 120 nm to about 180 nm. In some examples, the thickness can be about 105 nm, about 115 nm, about 135 nm, about 165 nm, about 195 nm, etc.

At 1430, a resin layer can be formed. In some implementations, a resin layer 1308 is formed at the polymer layer 1306. The resin layer 1308 can cover substantially the entire facing surface of the polymer layer 1306. The resin layer 1308 may be formed by spin coating, and/or spray coating, to name just a few examples. The resin layer 1308 has a lower refractive index than the polymer layer 1306.

At 1440, nanoimprinting of a grating and nanowells is performed. The resin layer 1308 and the polymer layer 1306 can facilitate a patterned flowcell and laser coupling by grating. The polymer layer 1306 is here shown in a longitudinal direction so that each of respective ridges 1310 extends into the plane of illustration. The polymer layer 1306 can include several of the ridges 1310, for example organized in respective groups 1312A and 1312B. For example, the groups 1312A-1312B can be respective input and output gratings for laser light. The ridges 1310 can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc.

The resin layer 1308 can include one or more nanowells 1314 defined between two or more walls 1316. In some implementations, the nanowell 1314 can have a size such that one or more of its dimensions ranges in the order of about one or more nanometers. For example, the nanowell(s) 1314 can be configured for receiving and holding the sample(s) during the analysis process, such as in form of clusters. An end (e.g., the bottom) of the nanowell 1314 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. In some implementations, the resin layer 1308 can have an average pitch between the nanowells 1314 of at least about 10 nm, about 0.1 µm, about 0.5 µm, about 1 µm, about 5 µm, about 10 µm, about 100 µm or more, and/or can have an average pitch of at most about 100 µm, about 10 µm, about 5 µm, about 1 µm, about 0.5 µm, about 0.1 µm or less. For example, the nanowells 1314 can have a pitch of about 600 to about 650 nm, e.g., the pitch can be about 610 nm to about 640 nm. In some examples, the pitch can be about 605 nm, about 615 nm, about 635 nm, about 655 nm, etc. The depth of each nanowell 1314 can be at least about 0.1 µm, about 1 µm, about 10 µm, about 100 µm or more. Alternatively or additionally, the depth can be at most about $1 \times 10^3$ µm, about 100 µm, about 10 µm, about 1 µm, about 0.1 µm or less.

Forming the ridges 1310 of the polymer layer 1306, and the nanowells 1314 of the resin layer 1308, can involve nanoimprinting to more than one depth. In some implementations, a dual-depth stamp can be used in the nanoimprinting process. For example, the ridges 1310 can be formed at a relatively greater depth than the nanowells 1314.

Figure 15:
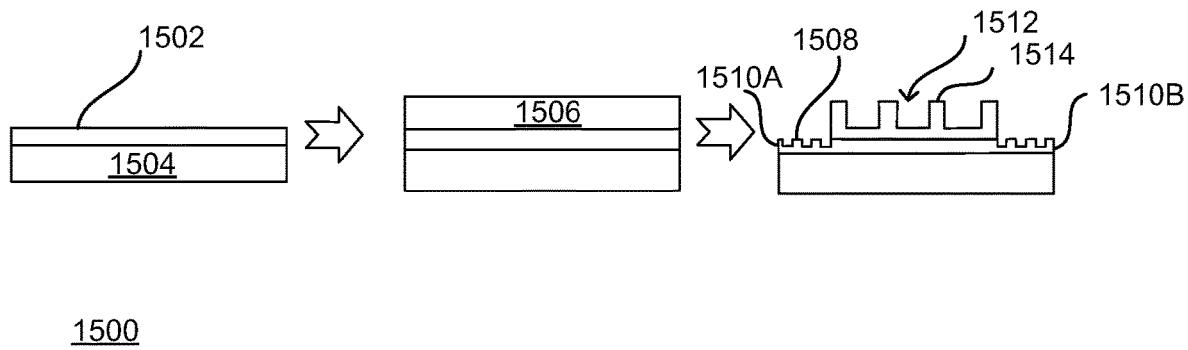
FIG. 15 shows an example of fabricating a planar waveguide.
Figure 16:
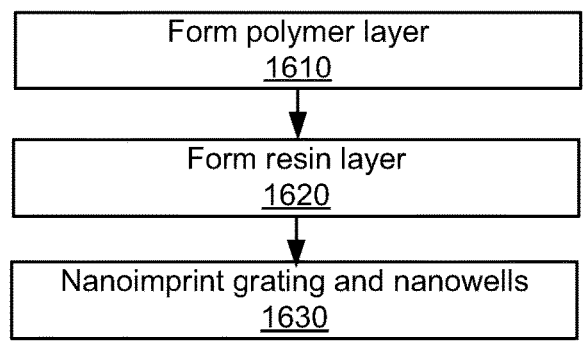
FIG. 16 shows a method of manufacturing a planar waveguide relating to the planar waveguide in FIG. 15.

FIG. 15 shows an example of fabricating a planar waveguide 1500. The planar waveguide 1500 can be used in one or more examples described herein. For example, the planar waveguide 1500 can accommodate one or more samples to facilitate illumination and excitation during sample analysis. FIG. 16 shows a method 1600 of manufacturing a planar waveguide relating to the planar waveguide in FIG. 15. The method 1600 can be combined with one or more other methods described herein. More or fewer operations can be performed, and/or two or more operations can be performed in a different order, unless otherwise indicated.

At 1610, a polymer layer can be formed. In some implementations, a polymer layer 1502 is formed at a substrate 1504. The polymer layer 1502 can include a UV-curable or thermal-curable polymer material. The polymer layer 1502 may be formed by spin coating, and/or spray coating, to name just a few examples. The polymer layer 1502 can serve as a core layer in the planar waveguide 1500. The polymer layer 1502 has a higher refractive index than the substrate 1504.

At 1620, a resin layer can be formed. In some implementations, a resin layer 1506 is formed at the polymer layer 1502. The resin layer 1506 can cover substantially the entire facing surface of the polymer layer 1502. The resin layer 1506 may be formed by spin coating, and/or spray coating, to name just a few examples. The resin layer 1506 has a lower refractive index than the polymer layer 1502.

At 1630, nanoimprinting of a grating and nanowells is performed. The resin layer 1506 and the polymer layer 1502 can facilitate a patterned flowcell and laser coupling by grating. The polymer layer 1502 is here shown in a longitudinal direction so that each of respective ridges 1508 extends into the plane of illustration. The polymer layer 1502 can include several of the ridges 1508, for example organized in respective groups 1510A and 1510B. For example, the groups 1510A-1510B can be respective input and output gratings for laser light. The ridges 1508 can have a pitch of about 200 to about 300 nm, to name just one example, e.g., between about 220 and about 280 nm. In some examples, the pitch can be about 205 nm, about 215 nm, about 235 nm, about 265 nm, about 285 nm, etc.

The resin layer 1506 can include one or more nanowells 1512 defined between two or more walls 1514. In some implementations, the nanowell 1512 can have a size such that one or more of its dimensions ranges in the order of about one or more nanometers. For example, the nanowell(s) 1512 can be configured for receiving and holding the sample(s) during the analysis process, such as in form of clusters. An end (e.g., the bottom) of the nanowell 1512 can have a thickness that accommodates propagation of evanescent light. For example, the thickness can be about 0 to about 500 nm, e.g., between about 100 nm and about 400 nm. In some examples, the thickness can be about 10 nm, about 50 nm, about 100 nm, about 200 nm, about 300 nm, about 450 nm, etc. In some implementations, the resin layer 1506 can have an average pitch between the nanowells 1512 of at least about 10 nm, about 0.1 µm, about 0.5 µm, about 1 µm, about 5 µm, about 10 µm, about 100 µm or more, and/or can have an average pitch of at most about 100 µm, about 10 µm, about 5 µm, about 1 µm, about 0.5 µm, about 0.1 µm or less. For example, the nanowells 1512 can have a pitch of about 600 to about 650 nm, e.g., the pitch can be about 610 nm to about 640 nm. In some examples, the pitch can be about 605 nm, about 615 nm, about 635 nm, about 655 nm, etc. The depth of each nanowell 1512 can be at least about 0.1 µm, about 1 µm, about 10 µm, about 100 µm or more. Alternatively or additionally, the depth can be at most about $1 \times 10^3$ µm, about 100 µm, about 10 µm, about 1 µm, about 0.1 µm or less.

Forming the ridges 1508 of the polymer layer 1502, and the nanowells 1512 of the resin layer 1506, can involve nanoimprinting to more than one depth. In some implementations, a dual-depth stamp can be used in the nanoimprinting process. For example, the ridges 1508 can be formed at a relatively greater depth than the nanowells 1512.

The above examples illustrate methods of manufacturing a flowcell including formation of a core layer (e.g., the core layer(s) 110, 310, 504, 710, 902, 1102, or 1302). The core layer is disposed between a substrate (e.g., the substrate(s) 102, 302, 502, 702, 904, 1104, 1304, or 1504) and a nanowell layer (e.g., the nanowell layer 112, 312, 510, 714, or 1114). The nanowell layer has nanowells to receive a sample. The core layer has a higher refractive index than the substrate and the nanowell layer.

The above examples illustrate methods of manufacturing a flowcell wherein forming the grating comprises photolithographic pattering (e.g., in FIG. 1) or nanoimprinting (e.g., in FIG. 3, 5, 7, 9, 11, 13, or 15).

The above examples illustrate methods of manufacturing a flowcell wherein the core layer is formed in a common process with forming the grating (e.g., in FIG. 5).

The above examples illustrate methods of manufacturing a flowcell wherein the core layer is formed in a separate process from forming the grating (e.g., in FIG. 1, 3, 7, 9, 11, 13, or 15).

The above examples illustrate methods of manufacturing a flowcell wherein the grating is formed by photolithographic patterning onto the substrate, the core layer is formed onto the grating, and the nanowell layer is formed onto the core layer (e.g., in FIG. 1).

The above examples illustrate methods of manufacturing a flowcell wherein the grating is formed by nanoimprinting onto the substrate, the core layer is formed onto the grating, and the nanowell layer is formed onto the core layer (e.g., in FIG. 3).

The above examples illustrate methods of manufacturing a flowcell wherein the grating is formed onto the substrate, the core layer is formed onto the grating, an additional layer is formed onto the core layer, and the nanowell layer is formed onto the additional layer (e.g., FIG. 7). The additional layer and the nanowell layer may initially be free of the nanowells, and the method may further comprise patterning the nanowell layer while the additional layer remains intact, and subsequently transferring the pattern of the nanowell layer to the additional layer so as to expose the core layer in the nanowells. The pattern may be transferred by etching.

The above examples illustrate methods of manufacturing a flowcell wherein the core layer is formed onto the substrate, and wherein the grating and the nanowells layer are formed onto the core layer (e.g., FIG. 5, 9, 11, 13, or 15).

The above examples illustrate methods of manufacturing a flowcell wherein the core layer is formed onto the substrate, the grating is formed onto the core layer, and the nanowell layer is formed onto the grating (e.g., FIG. 5, 11, 13, or 15).

The above examples illustrate methods of manufacturing a flowcell wherein the core layer is formed onto the substrate, a first layer is formed onto the core layer, a second layer is formed onto the first layer, and wherein the grating and the nanowells are formed into the first and second layers, respectively (e.g., FIG. 11 or 13).

The above examples illustrate methods of manufacturing a flowcell wherein the core layer is formed onto the substrate, a resin layer is formed onto the core layer, and the grating and the nanowells are formed in the resin layer (e.g., FIG. 9).

The above examples illustrate methods of manufacturing a flowcell wherein the grating and the nanowell layer are formed in a common process (e.g., FIG. 9, 13, or 15).

The above examples illustrate methods of manufacturing a flowcell wherein the grating and the nanowell layer are formed in the same layer of the flowcell (e.g., FIG. 9).

The above examples illustrate methods of manufacturing a flowcell wherein the grating and the nanowell layer are formed in separate layers of the flowcell (e.g., FIG. 13 or 15).

Figure 17:
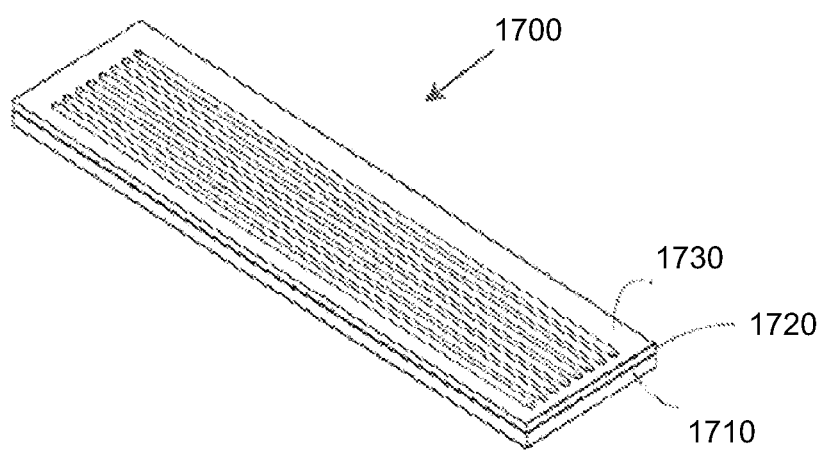
FIG. 17 shows an example of a flowcell.

FIG. 17 shows an example of a flowcell 1700. The flowcell 1700 can be used with one or more other examples described elsewhere herein. For example, one or more of the articles described above can be incorporated in, and/or one or more of the techniques described above can be used in manufacturing, the flowcell. The flowcell 1700 may be produced according to one or more of the disclosed techniques. In the flowcell 1700, a set of sealed chambers may be produced as a result of negative space in a gasket layer. The chambers may be sealed at the top and at the bottom by a substrate layer.

The flowcell 1700 here comprises a base layer 1710 (e.g., of borosilicate glass), channel layer 1720 (e.g., of etched silicon, etc.) overlaid upon the base layer, and cover, or top, layer 1730. When the layers are assembled together, enclosed channels are formed having inlet/outlets at either end through the cover. Some flowcells can comprise openings for the channels on the bottom of the flowcell.

Figure 18:
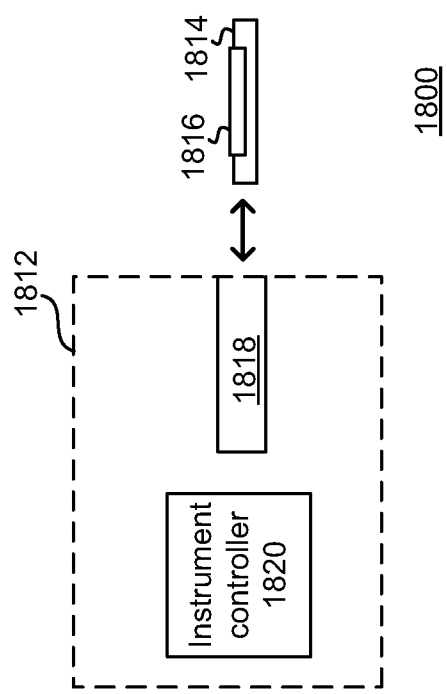
FIG. 18 is a diagram of a system including an instrument, a cartridge, and a flowcell.

FIG. 18 is a diagram of a system 1800 including an instrument 1812, a cartridge 1814, and a flowcell 1816. The system 1800 can be used for biological and/or chemical analysis. The system 1800 can be used together with, or in the implementation of, one or more other examples described elsewhere herein.

The cartridge 1814 can serve as a carrier for one or more samples, such as by way of the flowcell 1816. The cartridge 1814 can be configured to hold the flowcell 1816 and transport the flowcell 1816 into and out of direct interaction with the instrument 1812. For example, the instrument 1812 includes a receptacle 1818 (e.g., an opening in its outer enclosure) to receive and accommodate the cartridge 1814 at least during gathering of information from the sample. The cartridge 1814 can be made of any suitable material(s). In some implementations, the cartridge 1814 includes molded plastic or other durable material. For example, the cartridge 1814 can form a frame for supporting or holding the flowcell 1816.

Examples herein mention samples that are being analyzed. Such samples may include genetic material. In some implementations, the sample includes one or more template strands of genetic material. For example, using techniques and/or systems described herein, SBS can be performed on one or more template DNA strands.

The flowcell 1816 can include one or more substrates configured for holding the sample(s) to be analyzed by the instrument 1812. Any suitable material can be used for the substrate, including, but not limited to, glass, acrylic, and/or another plastic material. The flowcell 1816 can allow liquids or other fluids to selectively be flowed relative to the sample(s). In some implementations, the flowcell 1816 includes one or more flow structures that can hold the sample(s). In some implementations, the flowcell 1816 can include at least one flow channel. For example, a flow channel can include one or more fluidic ports to facilitate flow of fluid.

The instrument 1812 can operate to obtain any information or data that relates to at least one biological and/or chemical substance. The operation(s) can be controlled by a central unit or by one or more distributed controllers. Here, an instrument controller 1820 is illustrated. For example, the controller 1820 can be implemented using at least one processor, at least one storage medium (e.g., a memory and/or a drive) holding instructions for the operations of the instrument 1812, and one or more other components, for example as described in the following. In some implementations, the instrument 1812 can perform optical operations, including, but not limited to, illumination and/or imaging of the sample(s). For example, the instrument 1812 can include one or more optical subsystems (e.g., an illumination subsystem and/or an imaging subsystem). In some implementations, the instrument 1812 can perform thermal treatment, including, but not limited to, thermal conditioning of the sample(s). For example, the instrument 1812 can include one or more thermal subsystems (e.g., a heater and/or cooler). In some implementations, the instrument 1812 can perform fluid management, including, but not limited to, adding and/or removing fluid in contact with the sample(s). For example, the instrument 1812 can include one or more fluid subsystems (e.g., a pump and/or a reservoir).

Figure 19:
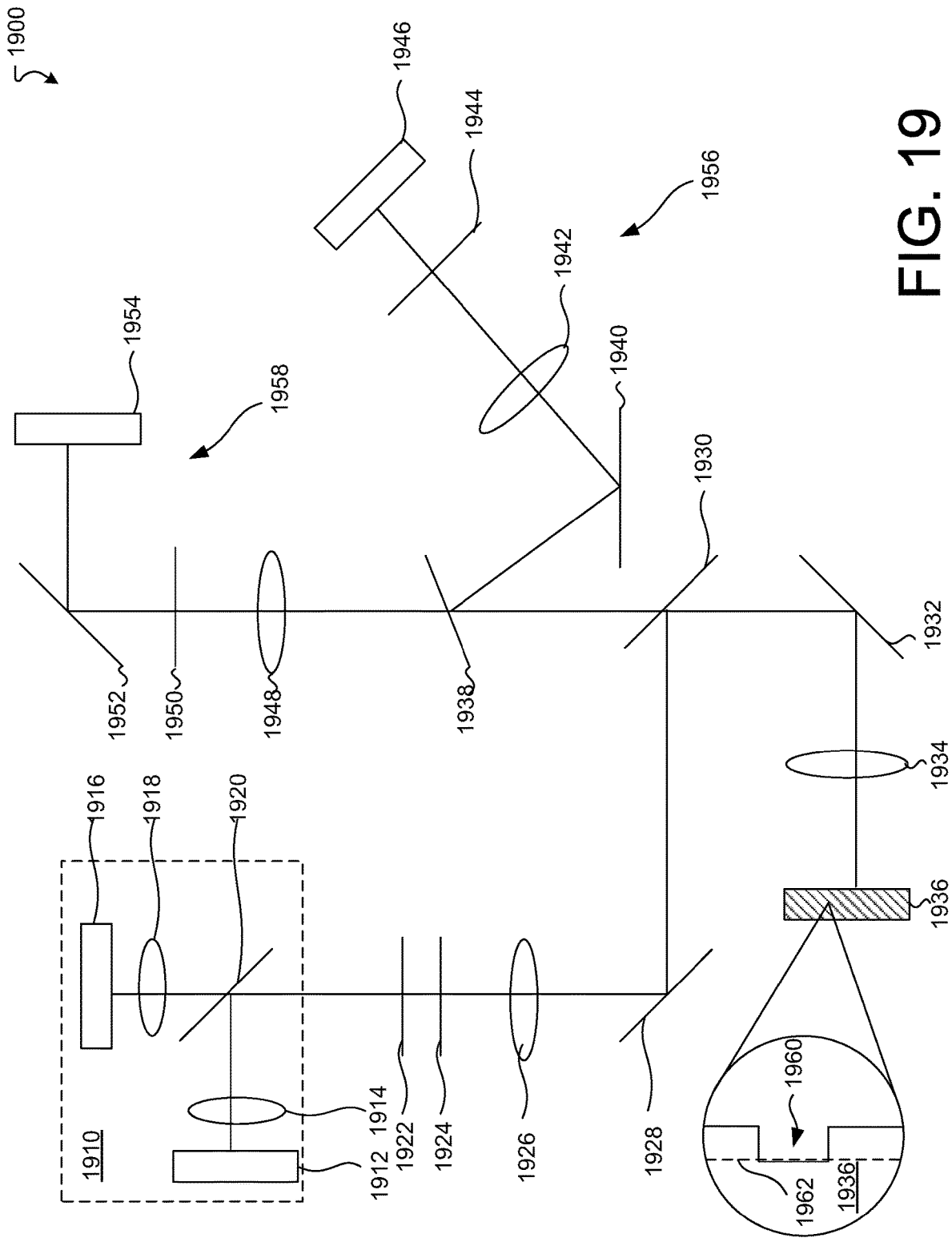
FIG. 19 is a diagram of an example illumination system.

FIG. 19 is a diagram of an example illumination system 1900. The illumination system 1900 includes a light source assembly 1910, a mirror 1928, an objective lens 1934, a flowcell 1936, an emission dichroic filter 1938, a first optical detection subsystem 1956, and a second optical detection subsystem 1958. The illumination system 1900 enables simultaneous imaging of two color channels. In some implementations, another illumination system can be configured to enable simultaneous imaging of more than two color channels, e.g., three color channels, four color channels, or more. It is noted that there may be other optical configurations that can produce a similar, simultaneous imaging of multiple color channels.

The light source assembly 1910 produces excitation illumination that is incident on the flowcell 1936. This excitation illumination in turn will produce emitted illumination, or fluoresced illumination, from one or more fluorescent dyes that will be collected using the lenses 1942 and 1948. The light source assembly 1910 includes a first excitation illumination source 1912 and corresponding converging lens 1914, a second excitation illumination source 1916 and corresponding converging lens 1918, and a dichroic filter 1920.

The first excitation illumination source 1912 and the second excitation illumination source 1916 exemplify an illumination system that can simultaneously provide respective excitation illumination lights for a sample (e.g., corresponding to respective color channels). In some implementations, each of the first excitation illumination source 1912 and the second excitation illumination source 1916 includes a light emitting diode (LED). In some implementations, at least one of the first excitation illumination source 1912 and the second excitation illumination source 1916 includes a laser. The converging lenses 1914 and 1918 are each set a distance from the respective excitation illumination sources 1912 and 1916 such that the illumination emerging from each of the converging lenses 1914/1918 is focused at a field aperture 1922. The dichroic filter 1920 reflects illumination from the first excitation illumination source 1912 and transmits illumination from the second excitation illumination source 1916.

In some implementations, the mixed excitation illumination output from the dichroic filter 1920 can directly propagate toward the objective lens 1934. In other implementations, the mixed excitation illumination can be further modified and/or controlled by additional intervening optical components prior to emission from the objective lens 1934. The mixed excitation illumination can pass through a focus in the field aperture 1922 to a filter 1924 and then to a color-corrected collimating lens 1926. The collimated excitation illumination from the lens 1926 is incident upon a mirror 1928 upon which it reflects and is incident on an excitation/emission dichroic filter 1930. The excitation/emission dichroic filter 1930 reflects the excitation illumination emitted from the light source assembly 1910 while permitting emission illumination, which will be described further below, to pass through the excitation/emission dichroic filter 1930 to be received by one or more optical subsystems 1956, 1958. The optical subsystems 1956 and 1958 exemplify a light collection system that can simultaneously collect multiplexed fluorescent light. The excitation illumination reflected from the excitation/emission dichroic filter 1930 is then incident upon a mirror 1932, from which it is incident upon the objective lens 1934 towards the flowcell 1936.

The objective lens 1934 focuses the collimated excitation illumination from the mirror 1932 onto the flowcell 1936. In some implementations, the objective lens 1934 is a microscope objective with a specified magnification factor of, for example, 1×, 2×, 4×, 5×, 6×, 8×, 10×, or higher. The objective lens 1934 focuses the excitation illumination incident from the mirror 1932 onto the flowcell 1936 in a cone of angles, or numerical aperture, determined by the magnification factor. In some implementations, the objective lens 1934 is movable on an axis that is normal to the flowcell (a "z-axis"). In some implementations, the illumination system 1900 adjusts the z position of the tube lens 1948 and tube lens 1942 independently.

The flowcell 1936 contains a sample, such as a nucleotide sequence or any other material, to be analyzed. The flowcell 1936 can include one or more channels 1960 (here schematically illustrated by way of a cross-section view in an enlargement) configured to hold sample material and to facilitate actions to be taken with regard to the sample material, including, but not limited to, triggering chemical reactions or adding or removing material. An object plane 1962 of the objective lens 1934, here schematically illustrated using a dashed line, extends through the flowcell 1936. For example, the object plane 1962 can be defined so as to be adjacent the channel(s) 1960.

The objective lens 1934 can define a field of view. The field of view can define the area on the flowcell 1936 from which an image detector captures emitted light using the objective lens 1934. One or more image detectors, e.g., detectors 1946 and 1954, can be used. The illumination system 1900 can include separate image detectors 1946 and 1954 for the respective wavelengths (or wavelength ranges) of the emitted light. At least one of the image detectors 1946 and 1954 can include a charge-coupled device (CCD), such as a time-delay integration CCD camera, or a sensor fabricated based on complementary metal-oxide-semiconductor (CMOS) technology, such as chemically sensitive field effect transistors (chemFET), ion-sensitive field effect transistors (ISFET), and/or metal oxide semiconductor field effect transistors (MOSFET).

In some implementations, the illumination system 1900 can include a structured illumination microscope (SIM). SIM imaging is based on spatially structured illumination light and reconstruction to result in a higher resolution image than an image produced solely using the magnification from the objective lens 1934. For example, the structure can consist of or include a pattern or grating that interrupts the illuminating excitation light. In some implementations, the structure can include patterns of fringes. Fringes of light can be generated by impinging a light beam on a diffraction grating such that reflective or transmissive diffraction occurs. The structured light can be projected onto the sample, illuminating the sample according to the respective fringes which may occur according to some periodicity. To reconstruct an image using SIM, the two or more patterned images are used where the pattern of excitation illumination are at different phase angles to each other. For example, images of the sample can be acquired at different phases of the fringes in the structured light, sometimes referred to as the respective pattern phases of the images. This can allow various locations on the sample to be exposed to a multitude of illumination intensities. The set of resulting emitted light images can be combined to reconstruct the higher resolution image.

The sample material in the flowcell 1936 is contacted with fluorescent dyes that couple to corresponding nucleotides. The fluorescent dyes emit fluorescent illumination upon being irradiated with corresponding excitation illumination incident on the flowcell 1936 from the objective lens 1934. The emitted illumination is identified with wavelength bands, each of which can be categorized to a respective color channel. The fluorescent dyes are chemically conjoined with respective nucleotides, e.g., containing respective nucleobases. In this way, a dNTP labeled with a fluorescent dye may be identified based upon an emitted light wavelength being within a corresponding wavelength band when detected by an image detector 1946, 1954.

The objective lens 1934 captures fluorescent light emitted by the fluoresced dye molecules in the flowcell 1936. Upon capturing this emitted light, the objective lens 1934 collects and conveys collimated light. This emitted light then propagates back along the path in which the original, excitation illumination arrived from the light source assembly 1910. It is noted that there is little to no interference expected between the emitted and excitation illumination along this path because of the lack of coherence between the emitted light and excitation illumination. That is, the emitted light is a result of a separate source, namely that of the fluorescent dye in contact with the sample material in the flowcell 1936.

The emitted light, upon reflection by the mirror 1932, is incident on the excitation/emission dichroic filter 1930. The filter 1930 transmits the emitted light to a dichroic filter 1938.

In some implementations, a dichroic filter 1938 transmits illumination associated with the blue color channel and reflects illumination associated with the green color channel. In some implementations, the dichroic filter 1938 is selected such that the dichroic filter 1938 reflects emitted illumination to an optical subsystem 1956 that is within the defined green wavelength band and transmits emitted illumination to an optical subsystem 1958 that is within the defined blue wavelength band, as discussed above. The optical subsystem 1956 includes a tube lens 1942, a filter 1944, and the image detector 1946. The optical subsystem 1958 includes a tube lens 1948, a filter 1950, and the image detector 1954.

In some implementations, the dichroic filter 1938 and the dichroic filter 1920 operate similarly to each other (e.g., both may reflect light of one color and transmit light of another color). In other implementations, the dichroic filter 1938 and the dichroic filter 1920 operate differently from each other (e.g., the dichroic filter 1938 may transmit light of a color that the dichroic filter 1920 reflects, and vice versa).

In some implementations, the emitted illumination encounters a mirror 1952 prior to the image detector 1954. In example shown, the optical path in the optical subsystem 1958 is angled so that the illumination system 1900 as a whole may satisfy space or volume requirements. In some implementations, both such subsystems 1956 and 1958 have optical paths that are angled. In some implementations, neither of the optical paths in the subsystem 1956 nor 1958 is angled. As such, one or more of multiple optical subsystems can have at least one angled optical path.

Each tube lens 1942 and 1948 focuses the emitted illumination incident upon it onto respective image detectors 1946 and 1954. Each detector 1946 and 1954 includes, in some implementations, a charged coupled device (CCD) array. In some implementations, each image detector 1946 and 1954 includes a complementary metal-oxide semiconductor (CMOS) sensor.

The illumination system 1900 is not required to be as shown in FIG. 19. For example, each of the mirrors 1928, 1932, 1940 may be replaced with a prism or some other optical device that changes the direction of illumination. Each lens may be replaced with a diffraction grating, a diffractive optic, a Fresnel lens, or some other optical device that produces collimated or focused illumination from incident illumination.

The terms "substantially" and "about" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. Also, when used herein, an indefinite article such as "a" or "an" means "at least one."

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

A number of implementations have been described. Nevertheless, it will be understood that various modifications may be made without departing from the spirit and scope of the specification.

In addition, the logic flows depicted in the figures do not require the particular order shown, or sequential order, to achieve desirable results. In addition, other processes may be provided, or processes may be eliminated, from the described flows, and other components may be added to, or removed from, the described systems. Accordingly, other implementations are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A flowcell, comprising:
   a substrate having a first side and a second side;
   a nanowell layer having a plurality of nanowells to receive a sample wherein each nanowell of the plurality of nanowells comprises a side wall and a bottom wall;
   a core layer disposed between the substrate and the nanowell layer, the core layer having a first refractive index and the substrate having a second refractive index and the nanowell layer having a third refractive index wherein the first refractive index is higher than the second refractive index and wherein the first refractive index is higher than the third refractive index; and
   a grating to couple light to the core layer, wherein the grating is disposed over the substrate and has a first group of ridges adjacent the first side of the substrate and a second group of ridges adjacent the second side of the substrate, wherein the first group of ridges is spaced apart from the second group of ridges by a substantially ridge-free area beneath the bottom walls.

2. The flowcell of claim 1, wherein the grating is disposed over the substrate, the core layer is disposed over the grating, and the nanowell layer is disposed over the core layer.

3. The flowcell of claim 2, further comprising a grating layer wherein the grating layer covers the substrate, the grating layer including the grating.

4. The flowcell of claim 1, further comprising a first resin layer including the grating wherein the first resin layer is disposed over the substrate, and the nanowell layer further comprises a second resin layer including the plurality of nanowells, the second resin layer disposed over the first resin layer.

5. The flowcell of claim 1, wherein the grating is disposed over the substrate, the flow cell further comprising a first polymer layer disposed over the grating, and a second polymer layer disposed over the first polymer layer, wherein the nanowell layer comprises the first and second polymer layers, the nanowells disposed in both the first and second polymer layers.

6. The flowcell of claim 1, wherein the core layer is disposed over the substrate, the flowcell further comprising a resin layer disposed over the core layer, the resin layer comprising the nanowell layer, wherein the grating and the nanowells are disposed in the resin layer.

7. The flowcell of claim 1, wherein the core layer is disposed over the substrate, the grating is disposed over the core layer, and the nanowell layer is disposed over the grating.

8. The flowcell of claim 7, further comprising a grating layer which covers the core layer, the grating layer including the grating.

9. The flowcell of claim 1, wherein the core layer is disposed over the substrate, the flowcell further comprising a polymer layer disposed over the core layer, and a resin layer disposed over the polymer layer, wherein the grating is disposed in the polymer layer, and wherein the nanowell layer comprises the resin layer.

10. The flowcell of claim 1, further comprising a polymer layer disposed over the substrate, and a resin layer disposed over the polymer layer, wherein the grating is disposed in the polymer layer, and wherein the nanowell layer comprises the resin layer.

11. The flowcell of claim 1, wherein the nanowell layer further comprises a portion defining a bottom of each nanowell of the plurality of nanowells wherein the portion has a thickness to accommodate propagation of evanescent light.

12. A flowcell, comprising:
   a substrate having a surface;
   a nanowell layer having a plurality of nanowells to receive a sample wherein each nanowell of the plurality of nanowells comprises a side wall and a bottom wall;
   a core layer disposed between the substrate and the nanowell layer, the core layer having a first refractive index and the substrate having a second refractive index and the nanowell layer having a third refractive index wherein the first refractive index is higher than the second refractive index and wherein the first refractive index is higher than the third refractive index; and
   a grating to couple light to the core layer, wherein the grating is disposed over the substrate and has a first group of ridges and a second group of ridges, the first group of ridges and the second group of ridges having a longitudinal configuration, wherein the first group of ridges is spaced apart from the second group of ridges by a substantially ridge-free area of the core layer beneath the bottom walls of the plurality of nanowells, the area covering the surface of the substrate.

13. The flowcell of claim 12, wherein the area beneath the nanowells is free of ridges.

* * * * *